United States Patent [19]

Kaneko

[11] Patent Number: 4,520,394
[45] Date of Patent: May 28, 1985

[54] HORIZONTAL SCANNING FREQUENCY MULTIPLYING CIRCUIT

[75] Inventor: Kenji Kaneko, Iwai, Japan
[73] Assignee: Victor Company of Japan, Ltd., Yokohama, Japan
[21] Appl. No.: 490,667
[22] Filed: May 2, 1983

[30] Foreign Application Priority Data

May 6, 1982 [JP] Japan .................................. 57-75784

[51] Int. Cl.$^3$ ...................... H04N 5/06; H04N 7/04; H04N 5/04
[52] U.S. Cl. ................................... 358/150; 358/158; 358/147
[58] Field of Search ............... 358/147, 148, 158, 310, 358/335, 150

[56] References Cited

U.S. PATENT DOCUMENTS 4,170,026 10/1979 Nagaaka et al. .................... 358/147
4,476,490 10/1984 Kaneko ............................... 358/140

Primary Examiner—Michael A. Masinick
Assistant Examiner—David E. Harvey
Attorney, Agent, or Firm—Posnack, Roberts, Cohen & Spiecens

[57] ABSTRACT

A horizontal scanning frequency multiplying circuit comprises a flip-flop supplied with an input horizontal synchronizing signal having a horizontal scanning frequency $f_H$ of a television signal, a phase-locked-loop (PLL) for producing a signal having a frequency $Nf_H$ (N is an integer over 1), a first counter supplied with an output signal of a voltage controlled oscillator within the PLL as a clock signal, for producing a counted output every time the clock signal is counted for a predetermined counting time T1 and supplying this counted output to the flip-flop to reset the flip-flop, a second counter supplied with the output signal of the voltage controlled oscillator as a clock signal, for counting this clock signal, a counted value setting circuit for producing a high-level output according to an output of the second counter when the second counter counts for a predetermined counting time T2, where T2>T1, and an OR-gate supplied with the input horizontal synchronizing signal and an output signal of the counted value setting circuit. The OR-gate supplies its output to the flip-flop to set the flip-flop and supplies its output to the second counter to reset the second counter.

5 Claims, 6 Drawing Figures

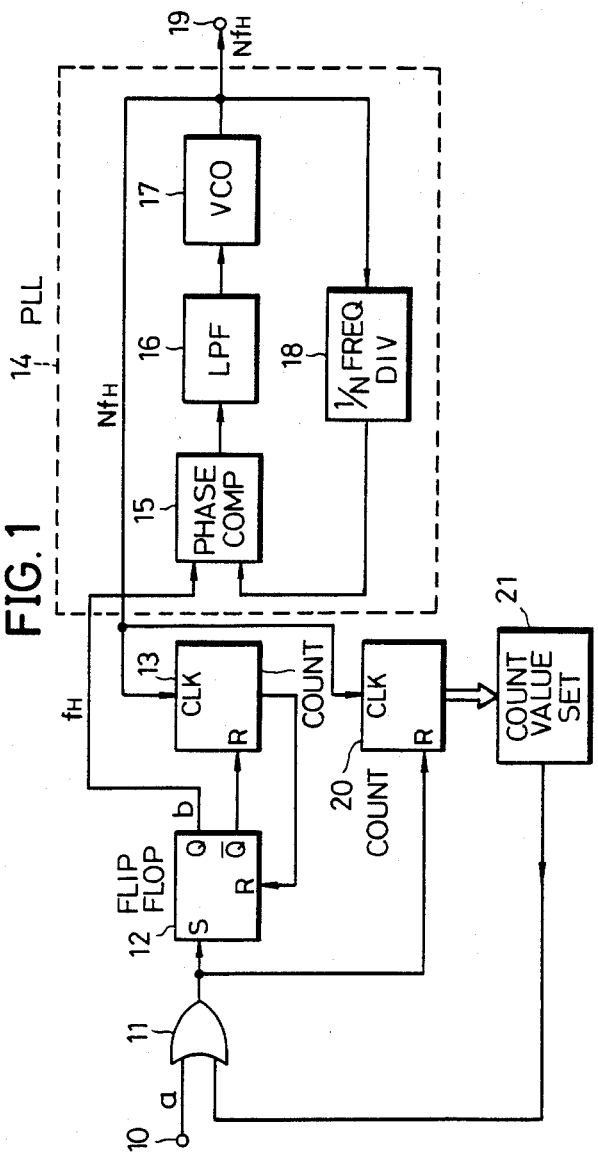

HORIZONTAL SCANNING FREQUENCY MULTIPLYING CIRCUIT

BACKGROUND OF THE INVENTION

The present invention generally relates to horizontal scanning frequency multiplying circuits, and more particularly to a horizontal scanning frequency multiplying circuit which synchronizes with the phase of a horizontal synchronizing signal within an input composite synchronizing signal to obtain a signal having a frequency which is a multiple of a horizontal scanning frequency even if there is dropout in a part of the input composite synchronizing signal, and has a circuit construction which facilitates the circuit to be manufactured in the form of an integrated circuit (IC).

Generally, when recording an address signal of a pulse-code-modulated (PCM) signal format onto a rotary recording medium together with a video signal, this address signal is recorded within a horizontal blanking period having a predetermined order (predetermined positional relationship) from a starting position of each field of the video signal. In addition, when broadcasting a signal in which a signal for displaying characters is multiplexed with the video signal, for example, the PCM signal describing the characters is inserted within the horizontal blanking period of the video signal. When recording, reproducing, or transmitting the video signal inserted with the above kind of a PCM signal, it becomes necessary to obtain a signal having a frequency which is a multiple of the horizontal scanning frequency. Accordingly, a horizontal scanning frequency multiplying circuit is used.

The conventional horizontal scanning frequency multiplying circuit had the following circuit construction. That is, a composite synchronizing signal is supplied to a first monostable multivibrator wherein the composite synchronizing signal is converted into a pulse series having a pulse width corresponding to a distance between a rise (or fall) in the horizontal synchronizing signal within the composite synchronizing signal and a position approximately 3H/4 (H indicates one horizontal scanning period) from that rise (or fall) in the horizontal synchronizing signal, and having a repetition frequency equal to the horizontal scanning frequency. This pulse series thus obtained, is supplied to a second monostable multivibrator from which another pulse series having a horizontal scanning frequency $f_H$ is obtained. This pulse series obtained from the second monostable multivibrator does not respond to an equalizing pulse or a vertical synchronizing signal within the input composite synchronizing signal, and responds only to the horizontal synchronizing signal. The above pulse series of the frequency $f_H$ is supplied to a phase-locked-loop (PLL). The PLL comprises a voltage controlled oscillator (VCO) which oscillates at a frequency $Nf_H$ (N is an integer), a frequency divider for frequency-dividing an output oscillation frequency of the VCO by 1/N, and a phase comparator for comparing phases of the output of the second monostable multivibrator and an output of the frequency divider and supplying an output error signal to the VCO to control the oscillation frequency of the VCO. A signal having a frequency $Nf_H$ which is N times the horizontal scanning frequency $f_H$, is accordingly obtained from the VCO.

However, the monostable multivibrator generally comprises a capacitor and a timing variable resistor for finely adjusting its time constant. Hence, if the above described conventional circuit as a whole is manufactured in the form of an integrated circuit, these capacitor and variable resistor must be provided external to the integrated circuit. This means that the number of pins of the integrated circuit is increased. Accordingly, the conventional horizontal scanning frequency multiplying circuit had a disadvantage in that it was not suited to be manufactured in the form of an integrated circuit. Furthermore, because the above fine adjustment of the time constant must be carried out during the manufacturing process, the productivity decreased.

Hence, in a U.S. patent application Ser. No. 359,017 filed Mar. 17, 1982 entitled "HORIZONTAL SCANNING FREQUENCY MULTIPLYING CIRCUIT" in which the assignee is the same as that of the present application, the present inventor has proposed a horizontal scanning frequency multiplying circuit which has eliminated the disadvantages of the conventional circuit described heretofore.

However, if the composite synchronizing signal is a signal which is reproduced from a recording medium such as a magnetic tape and a video disc, a part of the reproduced signal may be missing due to dropout and the like. In such a case, the operation of the horizontal scanning frequency multiplying circuit becomes unstable, and there was a problem in that a frequency multiplied signal could not be produced positively.

SUMMARY OF THE INVENTION

Accordingly, it is a general object of the present invention to provide a novel and useful horizontal scanning frequency multiplying circuit in which the above described problems have been eliminated.

Another and more specific object of the present invention is to provide a horizontal scanning frequency multiplying circuit constituted only from a flip-flop, counter, phase-locked-loop, logical summing circuit, and counted value setting circuit, which synchronizes with the phase of a horizontal synchronizing signal within a composite synchronizing signal to obtain a signal having a frequency which is a multiple of the horizontal scanning frequency. According to the circuit of the present invention, the horizontal scanning frequency multiplying circuit can easily be manufactured in the form of an integrated circuit, because a monostable multivibrator is not used as in the conventional circuit. Moreover, the productivity is high, since fine adjustment of a time constant of the monostable multivibrator need not be carried out during the manufacturing process. Further, even if a part of the composite synchronizing signal is missing due to dropout, it is possible to substantially compensate for such dropout, and a frequency multiplied signal having no dropout can be obtained stably and positively.

Other objects and further features of the present invention will be apparent from the following detailed description when read in conjunction with the accompanying drawings.

BRIEF DESCRIPTION OF THE DRAWINGS

FIG. 1 is a systematic block diagram showing an embodiment of a horizontal scanning frequency multiplying circuit according to the present invention;

FIGS. 2A and 2B are graphs respectively showing input and output signal waveforms of a flip-flop within the block system shown in FIG. 1;

DETAILED DESCRIPTION

Figure 3:
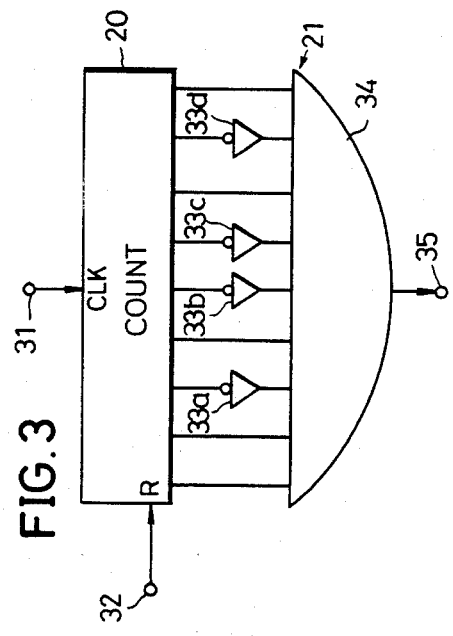
FIG. 3 is a diagram showing an example of a circuit constituting a part of the block system shown in FIG. 1.

In FIG. 1, a composite synchronizing signal a shown in FIG. 2A is applied to an input terminal 10, and supplied to one input terminal of an OR-gate 11. This composite synchronizing signal a is a composite synchronizing signal separated from a composite video signal which is reproduced from a recording medium such as a magnetic tape. As shown in FIG. 2A, the composite synchronizing signal a comprises a horizontal synchronizing signal HS, an equalizing pulse EQ, and a vertical synchronizing signal VS. FIG. 2A shows a vertical blanking period and a part in the vicinity of the vertical blanking period, of the composite synchronizing signal a.

An output signal of a counted value setting circuit 21 which will be described hereinafter is supplied to the other input terminal of the OR-gate 11, and a logical sum of this output signal and the composite synchronizing signal a is obtained. An output signal of the OR-gate 11 is applied to a set terminal S of a reset-and-set (R-S) flip-flop 12 and a reset terminal R of a counter 20. The flip-flop 12 is set by a rise in the horizontal synchronizing signal within the composite synchronizing signal applied to the set terminal S thereof.

A $\overline{Q}$-output of the flip-flop 12 is applied to a reset terminal R of a counter 13. When the flip-flop 12 is in a reset state, the level of the $\overline{Q}$-output of the flip-flop 12 is high, and the counter 13 stops its counting operation. The counted value in the counter 13 is zero in this state. Hence, the counter 13 starts a counting operation from zero, when the horizontal synchronizing signal is applied to the input terminal 10. A signal having a frequency $Nf_H$ (N is an integer over one, $f_H$ is the horizontal scanning frequency, and N=455, for example, in the present embodiment) which is obtained from a voltage controlled oscillator (VCO) 17 within a phase-locked-loop (PLL) 14, is applied to a clock input terminal CLK of the counter 13.

The counter 13 counts this signal having the frequency $Nf_H$ which is applied to the clock input terminal CLK thereof, and produces a counted output when a counting time of T1 seconds elapses. The counted output thus produced from the counter 13, is applied to the reset terminal R of the flip-flpp 12 to reset the flip-flop 12. When the flip-flop 12 is reset, the counter 13 also becomes reset by the $\overline{Q}$-output of the flip-flop 12, and the counter 13 accordingly stops the counting operation. The counting time T1 of the counter 13 is set to a value within a range described by H/2<T1<H (H indicates one horizontal scanning period), so that there is no effect due to the equalizing pulse EQ and the vertical synchronizing signal VS.

The flip-flop 12 is set and reset as described before to produce a signal b shown in FIG. 2B from its Q-output. This signal b is a pulse series having a pulse width T1, and a repetition frequency which is equal to the horizontal scanning frequency $f_H$. The signal b is in phase synchronism with the horizontal synchronizing signal HS, and is a pulse series having no relationships with the equalizing pulse EQ or the vertical synchronizing signal VS.

The output pulse series signal b of the flip-flop 12 is supplied to a phase comparator 15 within the PLL 14. Hence, the phases of the signal b and an output signal of a 1/N-frequency divider 18, are compared at the phase comparator 15. The output signal of the VCO 17 having the frequency $Nf_H$ is frequency-divided by 1/N at the 1/N-frequency divider 18, and supplied to the phase comparator 15 as a signal having a frequency $f_H$. An output error signal of the phase comparator 15 is applied to the VCO 17 through a lowpass filter 16, to control the oscillation frequency of the VCO 17. Accordingly, an output signal which is in phase synchronism with the horizontal synchronizing signal HS within the input composite synchronizing signal a, and having a frequency $Nf_H$ which is N times the horizontal scanning frequency $f_H$, is obtained from an output terminal 19.

In order not to be effected by the vertical synchronizing signal VS, the equalizing pulse EQ, and noise mixed within an interval in which the horizontal synchronizing signal HS is not obtained, it is desirable to set the counting time T1 of the counter 13 to a value close to 1H as much as possible. On the other hand, however, if the input composite synchronizing signal a is a signal separated from a video signal which is reproduced from a recording medium such as a magnetic tape and a disc, the composite synchronizing signal a comprises a jitter component. Accordingly, if it is known beforehand that the horizontal synchronizing signal will deviate by ±Δt due to the jitter component, for example, it is desirable to set the counting time T1 to a value slightly smaller than H−Δt. Therefore, by taking this into consideration, it is desirable to set the counting time T1 to a value within a range H/2 T1 H, and close to the value 1H as much as possible without being affected by the jitter component.

On the other hand, the output signal having the frequency $Nf_H$ which is obtained from the VCO 17 within the PLL 14, is also applied to a clock input terminal CLK of the counter 20. The counter 20 is reset by the output signal of the OR-gate 11, and counts the output signal of the VCO 17. A counted output of the counter 20 is supplied to a counted value setting circuit 21.

The output level of the counted value setting circuit 21 with respect to the OR-gate 11 is normally low. The output of the counted value setting circuit 21 assumes high level when supplied with the output of the counter 20 in a case where the counter 20 counts for an interval exceeding a predetermined counting time T2 (where H<T2<2H)after being reset.

An embodiment of the counted value setting circuit 21 is shown in FIG. 3. The counter 20 is supplied with the signal from the VCO 17 to its clock input terminal CLK through a clock input terminal 31, and also supplied with the output signal of the OR-gate 11 to its reset terminal R through a terminal 32. Outputs obtained through output ports corresponding to each of digits of the counter 20, are either supplied directly or through inverters 33a through 33d to a multiple-input AND-gate 34 constituting the counted value setting circuit 21. If the output values of the counter 20 after counting for an interval corresponding to the above predetermined counting time T2 are "110100101", for example, the inverters 33a through 33d are coupled to the output ports of the counter 20 which produce output values "0" among these output values. Accordingly, when the counter 20 continues to count for the predetermined counting time T2 and the output values assume the above specific values, the output values "1" are supplied to the AND-gate 34 as they are, while the output values "0" are inverted by the inverters 33a through 33d, and then supplied to the AND-gate 34. Therefore, all the output values supplied to the AND-gate 34 are "1". Thus, the value of at least one input to the AND-gate 34 is "0" until that point and the output level of the AND-gate 34 is "0" or low, however, when the level of the inputs to the AND-gate 34 all become "1", the output level of the AND-gate 34 becomes "1". This high-level output of the AND-gate 34 is supplied to the OR-gate 11 through a terminal 35.

Accordingly, in a normal case where there is no dropout in the input composite synchronizing signal a obtained through the input terminal 10, the counter 20 is reset for every horizontal scanning period H by the rise in the horizontal synchronizing signal of the signal a which has passed through the OR-gate 11, and each counting time of the counter 20 will not exceed the predetermined counting time T2. For this reason, the counted output of the counter 20 will not exceed a predetermined counted value, and the output level of the counted value setting circuit 21 remains low.

However, when there is dropout in the input composite synchronizing signal a and a horizontal synchronizing signal a1 indicated by a broken line in FIG. 2A which should originally exist is missing due to dropout, the counter 20 continues to count because the counter 20 is not reset by the horizontal synchronizing signal a1 which should originally exist. Moreover, the flip-flop 12 is not set. As a result, the Q-output b of the flip-flop 12 remains to assume the low level as indicated by a broken line in FIG. 2B, after the flip-flop 12 is reset by the counter 13. When the counter 20 continues to count and the counting time reaches the predetermined counting time T2 while the counted value reaches the predetermined value, the output of the counted value setting circuit 21 rises to high level from low level. This high-level output of the counted value setting circuit 21 is applied to the set terminal S of the flip-flop 12 through the OR-gate 11 to set the flip-flop 12, and at the same time, applied to the reset terminal R of the counter 20 to reset the counter 20.

Accordingly, even if the horizontal synchronizing signal a1 of the input composite synchronizing signal a shown in FIG. 2A is missing due to dropout, the flip-flop 12 is set after the predetermined counting time T2 elapses, and the Q-output signal b of the flip-flop 12 rises as indicated by b1 in FIG. 2B. This rising point b1 is shifted in phase from the original rise indicated by a solid line in FIG. 2B, that is, the rise in the case where the horizontal synchronizing signal a1 is missing due to dropout. However, the PLL 14 will remain synchronized even if a phase shift to such an extent exists, and will positively produce the signal having the multiplied frequency $Nf_H$. Thus, even if there is dropout in the horizontal synchronizing signal, there will be no effect due to such dropout, and it is possible to stably obtain a signal having the multiplied frequency.

Next, description will be given with respect to the use of the horizontal scanning frequency multiplying circuit according to the present invention. The circuit according to the present invention may be used for various use such as obtaining timing in a case where a color burst signal and the like is to be inserted at a predetermined position even when jitter exists, when a signal generator is synchronized with an output video signal reproduced from a recording medium so as to insert a character signal and the like or when encoding the reproduced output video signal into a color video signal in conformance with a certain color television system. However, as an embodiment of such use, description will be given with respect to a case where the circuit according to the present invention is applied to a horizontal scanning period detecting circuit by referring to FIG. 4.

Figure 4:
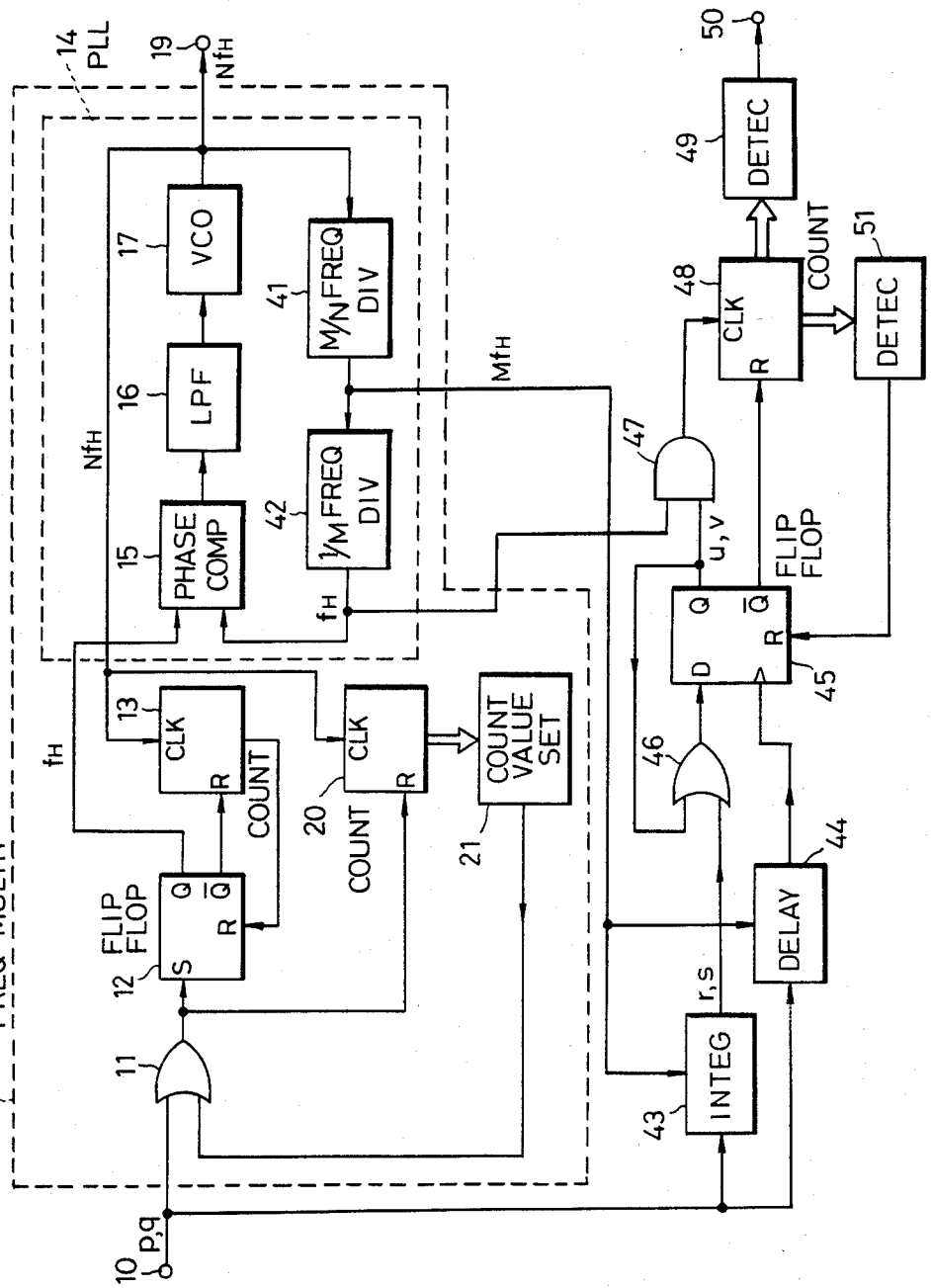
FIG. 4 is a systematic block diagram showing an embodiment of a horizontal scanning period detecting circuit applied to a horizontal scanning frequency multiplying circuit according to the present invention.

In FIG. 4, a horizontal scanning frequency multiplying circuit 40 as a circuit construction substantially the same as the horizontal scanning frequency multiplying circuit shown in FIG. 1, and those parts which are the same as those corresponding parts in FIG. 1 are designated by the same reference numerals and their description will be omitted. In the PLL 14 of the multiplying circuit 40, a series connection consisting of an M/N-frequency divider 41 and a 1/M-frequency divider 42 is provided instead of the 1/N-frequency divider 18 shown in FIG. 1. The output frequency $Nf_H$ of the VCO 17 is frequency-divided by M/N by the frequency divider 41, and formed into a signal having a frequency $Mf_H$ (where M is a natural number satisfying a relation $2 \leq M < N$). The output frequency $Mf_H$ of the frequency divider 41 is further supplied to the 1/M-frequency divider 42 and frequency-divided by 1/M, and formed into a signal having the frequency $f_H$. This output signal of the frequency divider 42 having the frequency $f_H$ is supplied to the phase comparator 15. The output of the frequency divider 41 is also supplied to an integrating circuit 43 and a delay circuit 44. The output of the frequency divider 42 is also supplied to one input terminal of the AND-gate 47.

Figure 5:
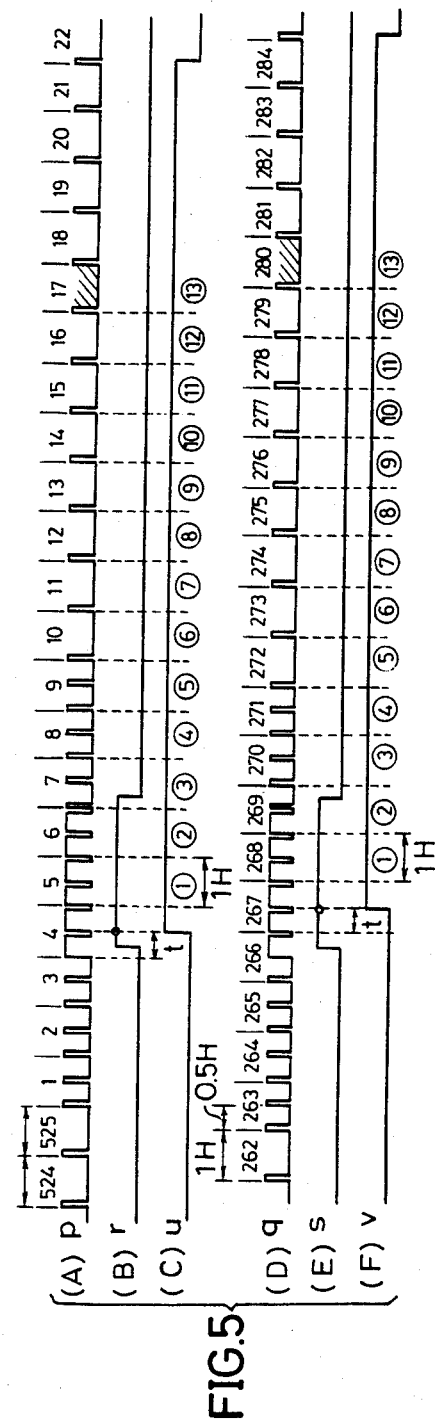
FIGS. 5(A) through 5(F) are graphs respectively showing signal waveforms for explaining the operation of the block system shown in FIG. 4.

The input composite synchronizing signal applied to the input terminal 10, is supplied to the OR-gate 11, integrating circuit 43, and the delay circuit 44 of the horizontal scanning frequency multiplying circuit 40. This input composite synchronizing signal applied to the input terminal 10 is the same as the composite synchronizing signal a shown in FIG. 2A, however, more accurately, the composite synchronizing signal is a composite synchronizing signal p shown in FIG. 5(A) for an odd field and a composite synchronizing signal q shown in FIG. 5(D) for an even field. In FIGS. 5(A) and 5(D), numerals shown above the waveforms respectively indicate scanning line numbers of a television signal having 525 scanning lines.

The integrating circuit 43 separates a vertical synchronizing pulse from the input composite synchronizing signals p and q, and produces vertical synchronizing signals r and s shown in FIGS. 5(B) and 5(E). These vertical synchronizing signals r and s are supplied to a data input terminal D of a flip-flop 45, through an OR-gate 46.

The delay circuit 44 obtains a pulse series having a repetition frequency $f_H$ which is introduced at a point delayed by a predetermined interval t from the beginning of each horizontal scanning period of the input composite synchronizing signals p and q, and supplied this pulse series to a clock input terminal of the flip-flop 45. Signals u and v shown in FIGS. 5(C) and 5(F) are obtained from a Q-output of the flip-flop 45. The Q-output of the flip-flop 45 is supplied to the other input terminal of the AND-gate 47. A logical sum of this Q-output of the flip-flop 45 and the signal having the horizontal scanning frequency $f_H$ which is in phase synchronism with the horizontal synchronizing signal within the input composite synchronizing signals p and q, is obtained at the AND-gate 47, and then supplied to a clock input terminal CLK of a counter 48 and counted therein. In addition, the Q-output of the flip-flop 45 is applied to the data input terminal D of the flip-flop 45 through the OR-gate 46. A $\overline{Q}$-output of the flip-flop 45 is applied to a reset terminal R of the counter 48.

The counter 48 carries out the counting in terms of fields, and starts to count the signal with the horizontal scanning period which is obtained from the AND-gate 47, from a point when the input signals u and v assume the level "1". When the counted value in the counter 48 becomes equal to "13", for example, a detecting circuit 49 having a circuit construction similar to that of the counted value setting circuit 21 shown in FIGS. 1 and 3 detects that the counted value in the counter 48 is "13" and produces a horizontal scanning period detection signal. This horizontal scanning period detection signal is obtained through an output terminal 50. Further, when the counted value in the counter 48 becomes equal to "18", for example, the detecting circuit 51 detects that the counted value is "18" and supplies a detection signal to a reset terminal R of the flip-flop 45 to reset the flip-flop 45. The counter 48 is reset by the $\overline{Q}$-output of the flip-flop 45 when the flip-flop 45 is reset.

In FIGS. 5(C) and 5(F), circled numerals respectively indicate counted values in the counter 48. According to the horizontal scanning period detection signal generated when the counted value in the counter 48 is the same counted value "13" for the odd and even fields, it is possible to detect scanning line numbers "17" and "280", that is, one horizontal scanning period (indicated by hatchings in FIGS. 5(A) and 5(D)) from a point when the eighth horizontal synchronizing signal is obtained after the equalizing pulse subsequent to the vertical synchronizing pulse in both the odd and even fields.

Therefore, by use of the horizontal scanning frequency multiplying circuit 40 according to the present invention, it is possible to obtain a horizontal scanning period detection signal for extracting various additional information such as an audio signal, character signal, still picture, and signal for detecting position on a recording medium which are multiplexed within predetermined horizontal scanning periods (intervals corresponding to the scanning line numbers "17" and "280" in the above described example) in both the odd and even fields within the vertical blanking period of the existing television signal.

Further, the present invention is not limited to these embodiments, but various variations and modifications may be made without departing from the scope of the present invention.

What is claimed is:

1. A horizontal scanning frequency multiplying circuit comprising:

a flip-flop circuit means supplied with an input horizontal synchronizing signal having a horizontal scanning frequency $f_H$ of a television signal, said flip-flop circuit means being set by said input horizontal synchronizing signal;

a phase-locked-loop comprising a voltage controlled oscillator for producing a signal having a frequency $Nf_H$ which is N times the horizontal scanning frequency $f_H$, where N is an integer over one, a frequency divider for frequency-dividing an output signal frequency of said voltage controlled oscillator, and a phase comparator supplied with one output signal of said flip-flop circuit means and an output signal of said frequency divider, for comparing phases of the two signals supplied thereto and for applying an output error signal to said voltage controlled oscillator to control the oscillation frequency of said voltage controlled oscillator, said phase-locked-loop producing the signal having the frequency $Nf_H$ from said voltage controlled oscillator.

a first counter supplied with and reset by the other output signal of said flip-flop circuit means, and supplied with the output signal of the voltage controlled oscillator within said phase-locked-loop as a clock signal, for producing a counted output every time the clock signal is counted for a predetermined counting time T1 and supplying the counted output to said flip-flop circuit means to reset said flip-flop circuit means;

a second counter supplied with said input horizontal synchronizing signal and reset by said input horizontal synchronizing signal, and supplied with the output signal of the voltage controlled oscillator within said phase-locked-loop as a clock signal, for counting the clock signal;

counted value setting means for producing a high-level output according to an output of said second counter when said second counter counts for a predetermined counting time T2, where T2>T1; and an OR-gate supplied with said input horizontal synchronizing signal and an output signal of said counted value setting means, for obtaining a logical sum of these signals supplied thereto, said OR-gate supplying an output to said flip-flop circuit means to set said flip-flop and also to said second counter to reset said second counter.

2. A horizontal scanning frequency multiplying circuit as claimed in claim 1 in which said counting time T1 is selected to a value satisfying H/2<T1<H, where H indicates one horizontal scanning period, and said counting time T2 is selected to a value satisfying H<T2<2H.

3. A horizontal scanning frequency multiplying circuit as claimed in claim 1 in which said counted value setting means comprises inverter means coupled to output ports of said second counter corresponding to digits from which output levels indicated by "0" are obtained among output ports of said second counter corresponding to digits from which output levels "1" and "0" are obtained when said second counter counts for said predetermined counting time T2, and a multiple-input AND-gate supplied with outputs of each of the digits in said second counter directly and indirectly through said inverter means, and the levels of inputs to said AND-gate all become "1" and said AND-gate produces said high-level output when said second counter counts for said predetermined counting time T2.

4. A horizontal scanning frequency multiplying circuit as claimed in claim 1 applied to a horizontal scanning period detecting circuit, in which said horizontal scanning frequency multiplying circuit further comprises means for supplying a composite synchronizing signal including said input horizontal synchronizing signal and a vertical synchronizing signal in odd and even fields of the television signal, said OR-gate is supplied with said composite synchronizing signal as said input horizontal synchronizing signal, said frequency divider in said phase-locked-loop comprises a first frequency divider having a frequency dividing ratio M/N supplied with the output of said voltage controlled oscillator, for producing an output signal having a frequency $Mf_H$, where M is a natural number satisfying $2 \leq M < N$, and a second frequency divider having a frequency dividing ratio 1/M supplied with an output of said first frequency divider, for supplying an output signal having a frequency $f_H$ to said phase comparator, and said horizontal scanning period detecting circuit comprises an integrating circuit supplied with said composite synchronizing signal and the output signal of said first frequency divider, for obtaining the vertical synchronizing signal within said composite synchronizing signal, a delay circuit supplied with said composite synchronizing signal and the output signal of said first frequency divider, for generating a timing pulse delayed by an interval corresponding to a sum of an interval which is ¼ the horizontal scanning period from respective beginnings of said horizontal synchronizing signal within said composite synchronizing signal and a delay time required for detecting the vertical synchronizing signal by said integrating circuit, another flip-flop for sampling the vertical synchronizing signal supplied from said integrating circuit by the timing pulse supplied from said delay circuit and holding a sampled value, an AND-gate for obtaining a logical sum of an output of said other flip-flop and the output signal of said second frequency divider, a third counter supplied with an output of said AND-gate, for counting the output of said AND-gate, and a detecting circuit for producing a detection output within predetermined horizontal scanning periods respectively corresponding to said odd and even fields when a counted value in said third counter assumes a predetermined value.

5. A horizontal scanning frequency multiplying circuit as claimed in claim 1 in which said horizontal synchronizing signal is a horizontal synchronizing signal within a composite synchronizing signal separated from a composite video signal which is reproduced from a recording medium and includes a jitter component, and said counting time T1 of said first counter is selected to a value as close to 1H as much as possible without being affected by said jitter component in said composite synchronizing signal.

* * * * *

UNITED STATES PATENT AND TRADEMARK OFFICE
CERTIFICATE OF CORRECTION

PATENT NO. : 4,520,394
DATED : May 28, 1985
INVENTOR(S) : KENJI KANEKO

It is certified that error appears in the above—identified patent and that said Letters Patent is hereby corrected as shown below:

Claim 1, column 8, line 34, between "flip-flop" and "and" insert --circuit means--.

Signed and Sealed this

Twelfth Day of November 1985

[SEAL]

Attest:

Attesting Officer

DONALD J. QUIGG

Commissioner of Patents and Trademarks